(12) United States Patent
Leistner et al.

(10) Patent No.: US 7,633,328 B2
(45) Date of Patent: Dec. 15, 2009

(54) MIXER STAGE AND METHOD FOR MIXING TWO SIGNALS HAVING DIFFERENT FREQUENCIES

(75) Inventors: Andreas Leistner, Flein (DE); Herman Jalli Ng, Pfullingen (DE); Hans Sapotta, Heilbronn (DE)

(73) Assignee: Atmel Automotive GmbH, Heilbronn (DE)

( * ) Notice: Subject to any disclaimer, the term of this patent is extended or adjusted under 35 U.S.C. 154(b) by 260 days.

(21) Appl. No.: 11/337,589

(22) Filed: Jan. 24, 2006

(65) Prior Publication Data

US 2006/0164149 A1  Jul. 27, 2006

(30) Foreign Application Priority Data

Jan. 24, 2005  (DE) .................. 10 2005 004 084

(51) Int. Cl.
G06G 7/12  (2006.01)
(52) U.S. Cl. ........................... 327/355; 327/359
(58) Field of Classification Search ............... None
See application file for complete search history.

(56) References Cited

U.S. PATENT DOCUMENTS

| | | | | |
|---|---|---|---|---|
| 5,642,071 A * | 6/1997 | Sevenhans et al. | .......... | 327/359 |
| 5,867,778 A * | 2/1999 | Khoury et al. | .............. | 455/321 |
| 5,920,810 A * | 7/1999 | Finol et al. | .................. | 455/313 |
| 6,531,920 B1 * | 3/2003 | Ishihara | ..................... | 330/254 |
| 6,760,353 B2 * | 7/2004 | Wang | ..................... | 372/38.02 |
| 6,819,913 B2 * | 11/2004 | Souto-Diez et al. | ......... | 455/313 |
| 6,892,061 B2 * | 5/2005 | Asam | ......................... | 455/313 |
| 2002/0013137 A1 | 1/2002 | Asam | | |
| 2006/0040634 A1 * | 2/2006 | Wang | ......................... | 455/313 |

FOREIGN PATENT DOCUMENTS

| | | |
|---|---|---|
| DE | 195 32 989 C1 | 11/1996 |
| DE | 100 37 247 A1 | 2/2002 |
| EP | 0 189 931 | 8/1986 |

* cited by examiner

*Primary Examiner*—Cassandra Cox
(74) *Attorney, Agent, or Firm*—Muncy, Geissler, Olds & Lowe, PLLC

(57) ABSTRACT

A mixer stage is provided that includes an oscillator, a first input, a second input, a first output, a second output, a set of four controllable amplifier elements, and a first current source. The mixer stage further includes at least one second current source in addition to the first current source, the first current source and the at least one second current source can each be switched on and off by an associated switching input that is connected to an associated oscillator output. Pairs of amplifier elements of the set of four together with at least one of the at least two current sources in its switched-on state form a differential amplifier for an input signal present at the first input and the second input. A method for mixing frequencies is also provided.

12 Claims, 3 Drawing Sheets

MIXER STAGE AND METHOD FOR MIXING TWO SIGNALS HAVING DIFFERENT FREQUENCIES

This nonprovisional application claims priority under 35 U.S.C. §119(a) on German Patent Application No. DE 102005004084.5, which was filed in Germany on Jan. 24, 2005, and which is herein incorporated by reference.

BACKGROUND OF THE INVENTION

1. Field of the Invention

The present invention relates to a mixer stage with an oscillator, a first input, a second input, a first output, a second output, a set of four controllable amplifier elements, and a first current source.

The invention further relates to a method for mixing a first signal which has a first frequency, with an oscillator signal, which has a second frequency, having the steps of: supplying the first signal in differential form to a first input and a second input of a mixer stage with an oscillator, a first output, a second output, a set of four controllable amplifier elements, and a first current source.

2. Description of the Background Art

A mixer stage is known in the form of a Gilbert cell, and a method is know through the operation of the Gilbert cell.

Since the invention of the Gilbert cell by Brad Gilbert in 1969, with some few exceptions, mixer cells have been implemented by a structure consisting of three stages wired in series. The first stage consists of a current source, or in the simpler case, a resistor, the second stage consists of a differential amplifier implemented using bipolar or unipolar technology, and the third stage has four switching transistors that invert the output current of the differential amplifier at the rate of an oscillator frequency. It is also known to use negative feedback resistors at the emitters of the switching transistors to improve the linearity of the input/output signal characteristics.

Modern semiconductor technologies reduce the feature sizes in all dimensions with the goal of increasing the packing density of circuits and the achievable cutoff frequencies. This is associated with a reduction in the dielectric strength. This phenomenon is familiar from different generations of personal computers, which are provided with steadily increasing clock frequencies and steadily reduced operating voltages. These technologies are also used in the communications field.

However, that which is possible in digital circuit technology causes problems in analog technology. The series circuit of three stages or circuit sections required in the Gilbert cell permits only a minimum voltage for each stage or circuit section. If one extrapolates this effect into the future, a point in time will soon be reached when it will no longer be possible to implement a Gilbert cell with further decreases in supply voltage.

In other applications, for example in cell phones, the supply voltage must be limited to the 3V that can be supplied by a single battery. When one subtracts the requirement for voltage regulation and swing (amplitude of the signal variation) at the load, only 1.5 to 2 V is left for the actual signal processing. This also sets a lower limit on practical implementation.

SUMMARY OF THE INVENTION

It is therefore an object of the present invention to provide a mixer stage and a method for mixing a first signal that has a first frequency with a second signal that has a second frequency, which mixer stage and method exhibit a reduced voltage requirement and attain the advantages of the aforementioned prior art mixer stage.

This object is attained in a mixer stage in that the mixer stage has at least one second current source in addition to the first current source, in that the first current source and the at least one second current source can each be switched on and off by an associated switching input that is connected to an associated oscillator output, and in that pairs of amplifier elements of the set of four together with at least one of the at least two current sources in its switched-on state form a differential amplifier for an input signal present between the first input and the second input.

This object is further attained in a method in that the first current source and at least one second current source are each periodically switched on and off by the oscillator signal through an associated switching input, and when a current source is switched on, the first signal is amplified by a differential amplifier formed by two amplifier elements of the set of four and the switched-on current source.

The invention thus differs structurally from the Gilbert cell in that it only needs one current source stage and a single additional stage in series therewith, the additional stage being composed of the set of four amplifier elements. It thus only needs two stages connected in series and has a correspondingly reduced voltage requirement, or alternatively permits larger section voltages across each one of the remaining two stages for the same voltage. Thus, in place of one DC current source, the invention provides two switched current sources that switch the mixer current on and off with opposing phases at the rate of the oscillator frequency. In a manner of speaking, then, the use of the switchable current sources integrates the differential amplifier from the Gilbert cell into the set of four amplifier elements.

In other words, the switching transistors known from the Gilbert cell function in the invention as amplifier elements that are modulated by the input signal and operate as differential amplifiers for the input signal when the current source is switched on, thus in a certain sense being put to multiple uses in addition to their function as switches. It is this multiple use of the amplifier elements as switches and differential amplifiers in conjunction with modulation of the amplifier elements by the differential input signal and the use of current sources switched by the oscillator signal that permits a reduction in the number of stages connected in series. By contrast, in the Gilbert cell the oscillator signal is used to control the switching transistors and the input signal is amplified by the separate differential amplifier located between the switching transistors and a DC current source.

An embodiment of the mixer stage is characterized by bipolar transistors as amplifier elements.

This embodiment in bipolar technology has a voltage requirement that is reduced further as compared to embodiments in unipolar technology.

An alternative embodiment has field-effect transistors as amplifier elements.

Although such embodiments in unipolar technology do require a higher supply voltage, they are characterized by a reduction in the influence of the noise of the current sources.

The mixer stage can have, for each amplifier element, an associated negative feedback resistor located in series between the amplifier element and the associated switchable current source.

Further, the mixer stage can have, for the set of four amplifier elements, a set of four switchable current sources and two negative feedback resistors, with the set of four switchable current sources including a first pair of switchable current sources and a second pair of switchable current sources, each current source being connected to one of the amplifier elements, each one of the two negative feedback resistors connecting the current sources of one pair of switchable current sources to the amplifier elements connected to these current sources, and switching inputs of each pair of current sources being jointly connected to an associated oscillator output.

In both embodiments, the negative feedback resistors linearize the input/output signal characteristics of the differential amplifier over wide ranges, thus permitting a desirable high intercept point for the arrangement.

During the phases in which the current sources are switched off, parasitic capacitances between base and emitter, or gate and source, of the associated amplifier elements are discharged only inadequately under certain circumstances.

This disadvantage is avoided by the following embodiment, in which the mixer stage has, for each current source, an additional control element with a first current connection, a second current connection, and a control connection, with first current connections of the two additional control elements being jointly connected to a supply voltage, and each second current connection of the two control elements being connected to a current connection of the associated current source.

The control elements can be driven when the current sources are switched off, thereby permitting discharge of the aforementioned capacitances to the second reference voltage.

The second current connections of the control elements can be connected between the associated current source and the associated negative feedback resistor.

Alternatively, the second current connections of the control elements can be connected between the associated current source and the associated amplifier element.

These embodiments combine the advantages resulting from the use of negative feedback resistors and control elements.

Another embodiment includes a transistor that is complementary to the transistors serving as amplifier elements, and serves as an additional control element. In this context, transistors that are complementary to one another are transistors that respond to a control signal of like polarity with opposite changes in conductivity. In this sense, for example, a p-channel MOSFET or a bipolar PNP transistor is complementary to both an n-channel MOSFET and a bipolar NPN transistor, and an n-channel MOSFET or a bipolar NPN transistor is complementary to both a p-channel MOSFET and a bipolar PNP transistor.

This embodiment has the advantage that, in controlling the additional control elements, a signal used to switch the current sources on and off, or a signal derived therefrom which has the same frequency and phase, results in the desired correlation between discharging of the capacitances involved and switching of the on/off state of the current sources.

Also, a square-wave signal can be used as the oscillator signal.

Square-wave signals have an infinitely steep rise when switching between their two levels. When such a signal is used as a switching signal for a component, the exact voltage level at which the component switches is unimportant to a first approximation. Initially, it is only important that it switches at all. By this means, desired switchover processes can be controlled with high precision in time even when multiple components with tolerances are to be switched in synchrony with one another. Another advantage of the square-wave signal is that its Fourier spectrum consists only of odd multiples of the oscillator frequency. Moreover, the terms at multiples of three, five, and so on of the oscillator frequency are also subject to factors of ⅓, ⅕, and so on, and thus decrease as the index numbering the Fourier components increases. Thus, the conversion of the first frequency of the first signal to another frequency that is performed by mixing or by multiplication with the square-wave signal is dominated by the first Fourier component, resulting in a defined displacement of the first frequency to an intermediate frequency resulting as the sum or difference of the first frequency and the oscillator frequency. In this regard, the oscillator frequency corresponds to the frequency of the first Fourier component. Due to the absence of Fourier components with even multiples of the oscillator frequency, other frequencies have a comparatively wide frequency separation and can thus easily be filtered out.

In embodiments of the mixer stage which have one or more additional control elements, each additional control element can be controlled with a square-wave signal such that it conducts when the associated current source is switched off and blocks when the associated current source is switched on.

As a result of this concrete circuit design embodiment, discharging of the capacitances between bases and emitters, or between gates and sources, of the transistors of the differential amplifier is controlled synchronously with the switchoff of the current sources, and thus with high precision in time.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
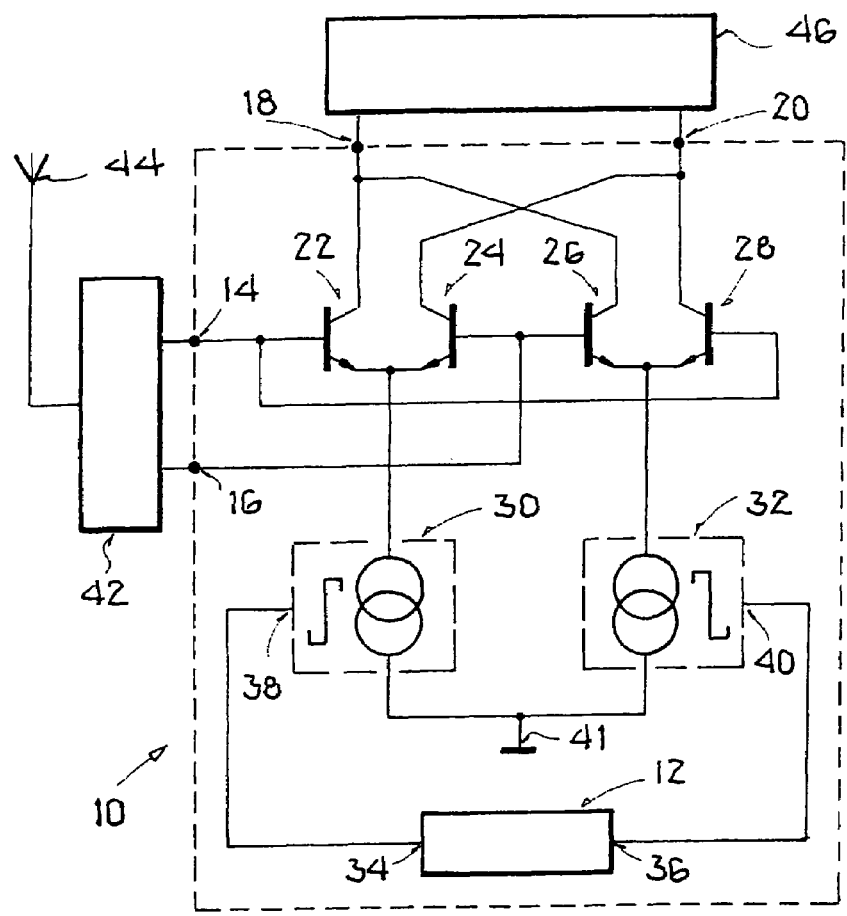
FIG. 1 illustrates a first example embodiment of a mixer stage with features of the invention.

FIG. 1 shows a mixer stage 10 with an oscillator 12, a first input 14, a second input 16, a first output 18, a second output 20, a set of four controllable amplifier elements 22, 24, 26, 28, a first current source 30, and a second current source 32. At oscillator outputs 34, 36, the oscillator 12 provides a differential square-wave signal, by means of which it is possible to differentially switch on and off in opposite phase the first current source 30 through an associated switching input 38, and a second current source 32 through an associated switching input 40. The square-wave signal thus switches the current sources 30, 32 on and off periodically, with the first current source 30 being switched on (switched off) when the second current source 32 is switched off (switched on). In addition, both current sources 30, 32 are connected to a ground potential 41.

An input circuit 42 provides a first signal with a first frequency in differential form between the inputs 14 and 16. The first signal is, for example, an analog receive signal of an antenna 44 conditioned and amplified by the input circuit 42. A first amplifier element 22 and a second amplifier element 24, together with the first current source 30 in its switched-on state, constitute a first differential amplifier that is modulated by the first differential signal. When the second current source 32 is switched on, said current source 32, together with a third amplifier element 26 and a fourth amplifier element 28, forms a second differential amplifier that is likewise modulated by the first differential signal. In this process, modulation of the two differential amplifiers takes place such that the conductivity of the first amplifier element 22 is increased (reduced) together with the conductivity of the fourth amplifier element 28 when the conductivity of the second amplifier element 24 is reduced (increased) together with the conductivity of the third amplifier element 26. In the embodiment in FIG. 1, the amplifier elements 22, 24, 26, 28 are implemented as bipolar NPN transistors. This embodiment in bipolar technology has a further reduced voltage requirement as compared to embodiments using unipolar technology.

When the first current source 30 is switched on, which is to say during first time segments, this mixer stage 10 reproduces a signal present at the first input 14, as an output signal at the first output 18, while maintaining its polarity. At the same time, a signal that is present at the second input 16 is reproduced as an output signal at the second output 20 when the first current source 30 is switched on.

With opposite phase, which is to say during the second time segments complementary to the first time segments, the input signal of the input 14 is reproduced as an output signal at the second output 20 when the second current source 32 is switched on. Analogously, the switched-on second current source 32 reproduces an input signal of the second input 16 as an output signal at the first output 18 during the second time segments.

As a result, the product of the first input signal and the oscillator signal is then present between the outputs 18 and 20. If one applies a sine wave with a first frequency as the first signal and multiplies this sine wave by a Fourier representation of the square-wave function, which is to say by a series of sine waves with frequencies at one, three, five, ..., (2n-1) times the oscillator frequency (n=1, 2, ... ), the first Fourier component, which is to say n=1, results in a product of two sine functions, of which one oscillates at the first frequency and one oscillates at the oscillator frequency as the second frequency. It can be shown by applying the addition theorems that this product is proportional to the sum of a sine function whose argument depends on the sum of the first and second frequencies, and a sine function whose argument is proportional to the difference of the first and second frequencies.

By means of filtering, which can be accomplished in an output circuit 46 for example, either the sum or the difference is filtered out. Furthermore, all frequencies that result from products of the first input signal with Fourier components higher than the first order are also filtered out.

Figure 2:
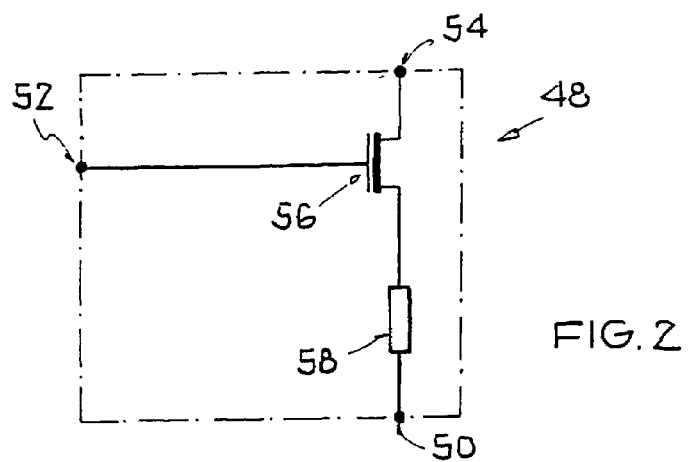
FIG. 2 illustrates a possible circuit implementation of a switchable current source.

FIG. 2 shows a circuit embodiment of the current sources 30, 32 from FIG. 1 in the form of a switchable current source 48 that has a reference voltage connection 50, a control input 52, a current connection 54, a switching element 56, and a resistor 58 in series with the switching element 56. The reference voltage connection 50 can lead to the first reference voltage 41 from FIG. 1. In the switched-off state, the switching element 56, implemented here as a field-effect transistor, blocks. The control input 52 is connected to one of the oscillator outputs 34, 36 from FIG. 1, which likewise may provide the first reference voltage as the low signal level of the square-wave signal. Then the field-effect transistor 56 is not switched on. In contrast, when the oscillator 12 supplies the high level of the square-wave signal at the connection 52, the field-effect transistor serving as the switching element 56 is driven to the conducting state. The current output 54 of the switchable current source 48 is connected to the first or second differential amplifier from FIG. 1. Consequently, a flow of current is switched on by the arrangements of FIGS. 1 and 2, wherein the voltage difference from the first reference voltage driving the current flow is provided by the output circuit 46 from FIG. 1, for example.

It is understood that this embodiment of the current sources 30, 32 from FIG. 1 as current source 48 from FIG. 2 is strictly in the nature of an example, and that switchable current sources 30, 32 can also be implemented in other ways in general. Thus, the resistor 58 may also be omitted.

Figure 3:
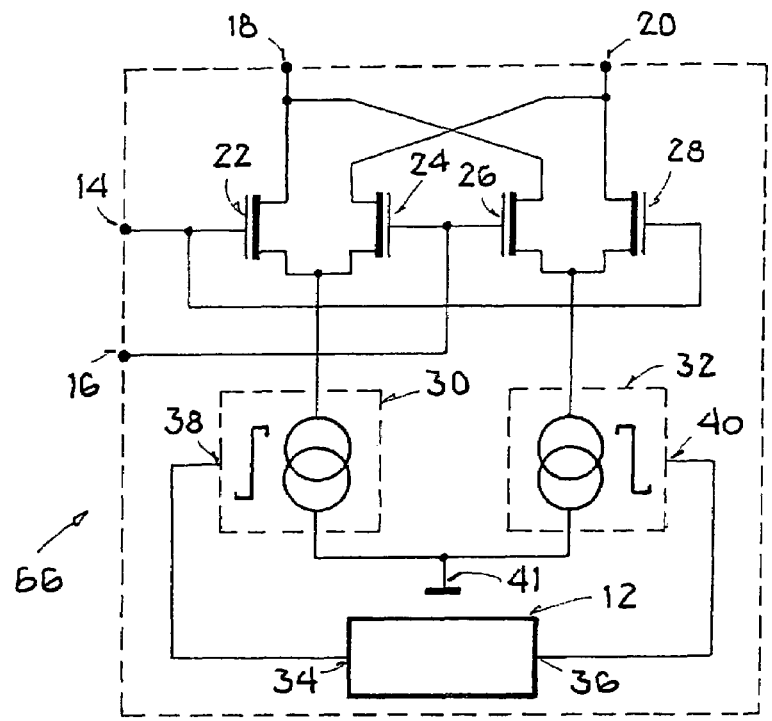
FIG. 3 illustrates another embodiment with features of the invention.

FIG. 3 shows a mixer stage 66 in which the amplifier elements 22, 24, 26, 28 are implemented as field-effect transistors, in particular as NMOSFETs. Although such embodiments in unipolar technology do require a higher supply voltage, they are characterized by a reduced influence of the noise of the current sources. The mixer stage 66 is otherwise identical to the mixer stage 10 from FIG. 1, so an understanding of its function may be achieved by referring to the corresponding explanations for FIG. 1. In FIGS. 1 and 3, as in all other figures as well, like elements are identified with like reference numbers.

The differential amplifiers in FIGS. 1 and 3 formed by the amplifier elements 22 and 24 and also the amplifier elements 26 and 28 when the relevant current source 30, 32 is switched on can be linearized over wide ranges by emitter resistors in mixer stage 10 or by source resistances in mixer stage 66 in FIG. 3, making it possible to achieve a high intercept point for the arrangement.

Linearization can be accomplished by four identical resistors connected in series to the emitters (sources). Alternatively, two additional current sources may be used, which are connected by means of one resistor located between each of the emitters (sources).

Figure 4:
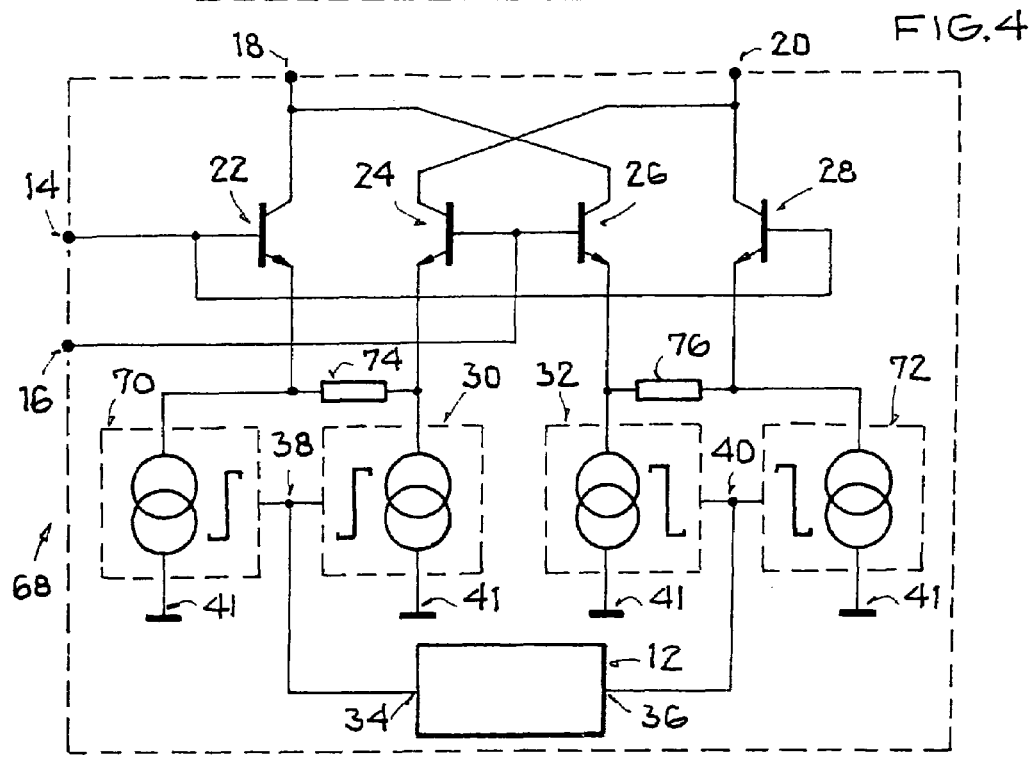
FIG. 4 illustrates an embodiment with linearizing resistors.

FIG. 4 shows a mixer stage 68 in which the latter embodiment is realized. This mixer stage 68 has, for the set of four amplifier elements 22, 24, 26, 28, a set of four switchable current sources 70, 30, 32, 72 and two resistors 74, 76. The set of four switchable current sources 70, 30, 32, 72 includes a first pair of switchable current sources 70, 30 and a second pair of switchable current sources 32, 72. Each current source 70, 30, 32, 72 is connected to one of the amplifier elements 22, 24, 26, 28, and each one of the two resistors 74, 76 connects the current sources of one pair 70, 30 or 32, 72 of switchable current sources 70, 30, 32, 72 to the amplifier elements 22 and 24 or 26 and 28 connected to these current sources 70, 30, 32, 72. In this regard, the switching inputs 38, 40 of each pair 30, 70 or 32, 72 of the current sources 70, 30, 32, 72 are jointly connected to an associated oscillator output 34 or 36. As in the subject matter of FIG. 1, the set of four amplifier elements 22, 24, 26, 28 is constructed of bipolar transistors. It is a matter of course, however, that field-effect transistors may alternatively also be used, as disclosed in connection with the subject matter of FIG. 3.

Figure 5:
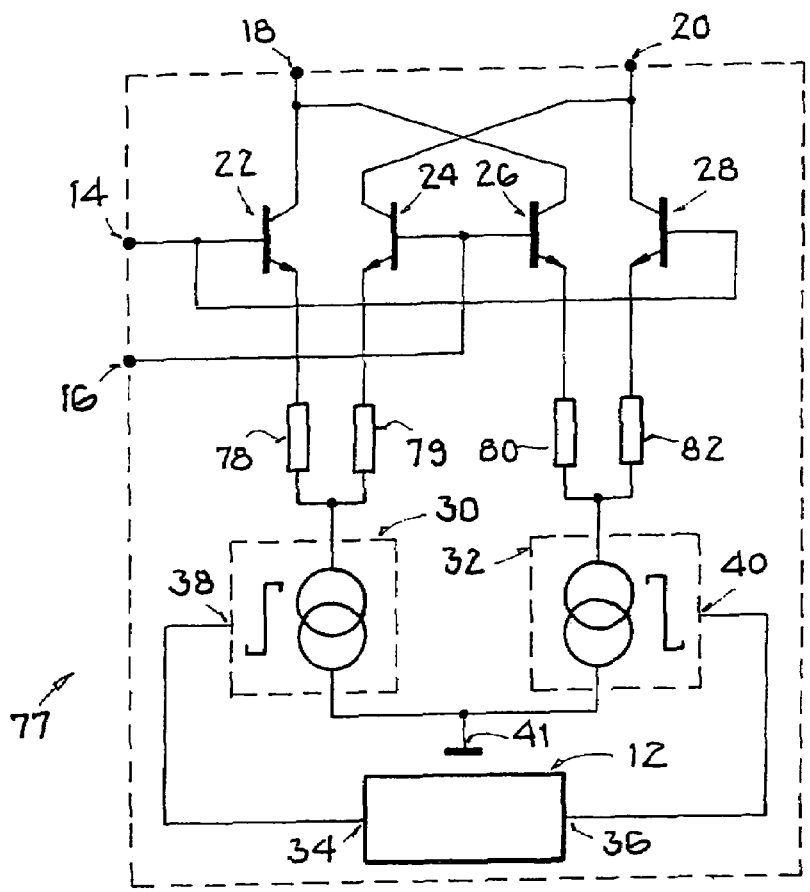
FIG. 5 illustrates an alternative embodiment with linearizing resistors.

This applies analogously to the embodiment of FIG. 5, which shows an alternative mixer stage 77 with four additional negative feedback resistors 78, 79, 80, 82. In this design, each amplifier element 22, 24, 26, 28 has associated with it a negative feedback resistor 78, 79, 80, 82 that is located in series between the amplifier element 22, 24 or 26, 28 and the associated switchable current source 30 or 32.

Otherwise, the mixer stages 68 and 77 in FIGS. 4 and 5 correspond largely to the mixer stage 10 in FIG. 1, so in each case an explanation of the basic mode of operation may be found by referring to the corresponding explanations for FIG. 1.

Figure 6:
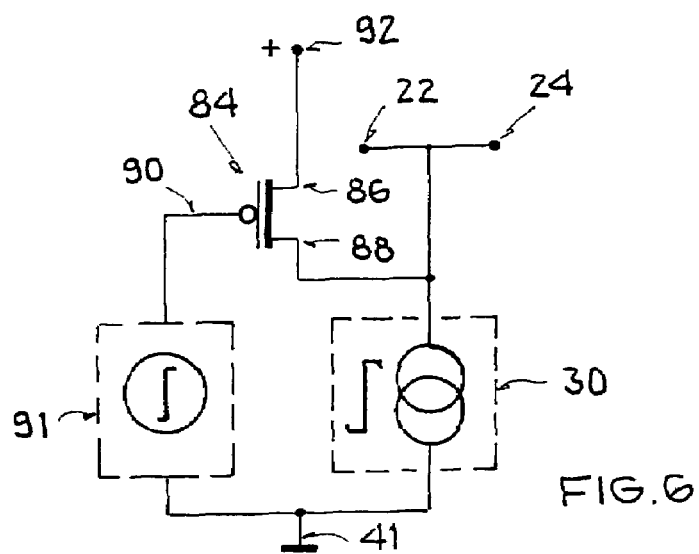
FIG. 6 illustrates a possible augmentation of inventive mixer stages with control elements for selective discharging of capacitances of the amplifier elements.

In order to selectively discharge the capacitances between emitters and bases, or between sources and gates, of the amplifier elements 22, 24, 26, 28 when the current sources 30 and 32 are switched off or, respectively, when each pair of current sources 30, 70 or 32, 72 is switched off, each of the embodiments explained above can be augmented by additional control elements 84 as is shown in detail in FIG. 6.

Each control element 84 has a first current connection 86, a second current connection 88, and a control connection 90. First current connections 86 of the additional control elements 84 are connected to a reference voltage 92, for example the supply voltage for the circuit, which can be provided through the output circuit 46, and each second current connection 88 of the additional control elements 84 is connected to a current connection of an associated current source 48, 30, 32 or of a pair 30, 70 or 32, 72 of associated current sources 30, 70, 32, 72. In mixer stages 68, 77 with negative feedback resistors 74, 76, 78, 79, 80, 82, the second current connections 88 of the control elements 84 are connected between the associated current source 48, 30, 70, 32, 72 and the associated negative feedback resistor 74, 76, 78, 79, 80, 82. In mixer stages 10, 66, which have no negative feedback resistors, the first current connections 86 of the control elements 84 are connected between the associated current source 30, 32 and the associated amplifier element 22, 24 and 26, 28. FIG. 6 shows the case of a control element 84 that is located between the current source 30 and the first differential amplifier consisting of amplifier elements 22, 24.

In each case, the control elements 84 can be implemented by a transistor that is complementary to the transistors serving as amplifier elements 22, 24, 26, 28. Then, a signal serving to switch on and off the current sources 48, 30, 70, 32, 72, or a signal of equal frequency and phase derived therefrom, when used to operate the additional control elements 84, results in the desired correlation between discharging the involved capacitances and switching the on/off states of the current sources 48, 30, 70, 32, 72. The important point is that the amplifier elements 84 are driven into conduction when the current sources 48, 30, 70, 32, 20 are switched off, thereby causing a discharge of the aforementioned capacitances to the supply voltage 92. If they are driven with a signal that is inverted with respect to the control signal of the current sources 48, 30, 70, 32, 72, the control elements can also have the same conductivity type as the amplifier elements 22, 24, 26, 28. Accordingly, the switching elements 84 are driven by a square-wave voltage generator 91 or directly by an oscillator output 34, 36.

Moreover, it is noted that the transistors shown can be replaced throughout by complementary transistors if, at the same time, the polarity of the ground potential and supply voltage is reversed.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A mixer stage comprising:
an oscillator;
a first input;
a second input;
a first output;
a second output;
a set of four controllable amplifier elements; and
a set of four switchable current sources and two resistors for the set of four controllable amplifier elements,
wherein a first pair of said set of four switchable current sources and a second pair of said set of four switchable current sources are each being switched on and off by an associated switching input that is connected to an associated oscillator output,
wherein pairs of amplifier elements of the set of four controllable amplifier elements, with at least one of the first and second pair of current sources in its switched-on state, form a differential amplifier for an input signal present at the first input and the second input, and
wherein each of the set of four switchable current sources is connected in series to one of the set of four controllable amplifier elements, and
wherein said first pair of switchable current sources is connected by a first resistor of the two resistors and said second pair of switchable current sources connected by a second resistor of the two resistors.

2. The mixer stage according to claim 1, wherein the amplifier elements are bipolar transistors.

3. The mixer stage according to claim 1, wherein the amplifier elements are field-effect transistors.

4. The mixer stage according to claim 1, wherein the mixer stage has, for each controllable amplifier element, an associated negative feedback resistor located in series between each of the controllable amplifier elements and an associated pair of said first and second pair of switchable current sources.

5. A mixer stage comprising:
an oscillator;
a first input;
a second input;
a first output;
a second output;
a set of four controllable amplifier elements; and
a first current source,
wherein the mixer stage has at least one second current source in addition to the first current source,
wherein the first current source and the at least one second current source each being switched on and off by an associated switching input that is connected to an associated oscillator output,
wherein pairs of amplifier elements of the set of four controllable amplifier elements, with at least one of the at least two current sources in its switched-on state, form a differential amplifier for an input signal present at the first input and the second input, and
wherein the mixer stage has, for each current source, an additional control element with a first current connection, a second current connection, and a control connection, with first current connections of the additional control elements being jointly connected to a supply voltage, and each second current connection of the control elements being connected to a current connection of the associated current source.

6. The mixer stage according to claim 5, wherein the second current connections of the control elements are connected between the associated current source and an associated negative feedback resistor.

7. The mixer stage according to claim 5, wherein the second current connections of the control elements are connected between the associated current source and the associated amplifier element.

8. The mixer stage according to claim 5, further comprising a transistor that is complementary to transistors serving as amplifier elements, the transistor functioning as the additional control element.

9. The mixer stage according to claim 5, wherein, the additional control element for each current source is controlled with a square-wave signal such that the additional control element conducts when the associated current source is switched off and blocks when the associated current source is switched on.

10. A method of mixing a first signal, which has a first frequency, with an oscillator signal, which has a second frequency, the method comprising:
supplying the first signal in differential form to a first input and a second input of a mixer stage having an oscillator, a first output, a second output, a set of four controllable amplifier elements, and a set of four switchable current sources and two resistors, with the set of four switchable current sources including a first pair of switchable current sources and a second pair of switchable current sources, each current source being connected to one of the amplifier elements, each one of the two resistors connecting the current sources of one pair of switchable current sources to the amplifier elements connected to these current sources, and switching inputs of each pair of current sources being jointly connected to an associated oscillator output; and
periodically switching on and off by the oscillator signal the first pair of switchable current sources and the second pair of switchable current sources through an associated switching input,
wherein, when the first pair of switchable current sources or the second pair of switchable current sources is switched on, the first signal is amplified by a differential amplifier formed by two amplifier elements of the set of four controllable amplifier elements and the switched-on pair of current sources, and
wherein each one of said set of switchable current sources include a switching element, and a resistor in series with the switching element.

11. The method according to claim 10, wherein the oscillator signal is a square-wave signal.

12. A method of mixing a first signal, which has a first frequency, with an oscillator signal, which has a second frequency, the method comprising:
supplying the first signal in differential form to a first input and a second input of a mixer stage having an oscillator, a first output, a second output, a set of four controllable amplifier elements, and a first current source;
periodically switching on and off by the oscillator signal the first current source and at least one second current source through an associated switching input,
wherein, when the first current source or the at least one second current source is switched on, the first signal is amplified by a differential amplifier formed by two amplifier elements of the set of four controllable amplifier elements and the switched-on current source, and
controlling an additional control element with a square-wave signal such that the additional control element conducts when the associated current source is switched off and blocks when the associated current source is switched on.

* * * * *